(12) United States Patent
Ohsumi

(10) Patent No.: US 9,928,400 B2
(45) Date of Patent: Mar. 27, 2018

(54) WIRING BOARD FOR FINGERPRINT SENSOR

(71) Applicant: KYOCERA Corporation, Kyoto-shi, Kyoto (JP)

(72) Inventor: Kohichi Ohsumi, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 13 days.

(21) Appl. No.: 15/271,420

(22) Filed: Sep. 21, 2016

(65) Prior Publication Data

US 2017/0091511 A1  Mar. 30, 2017

(30) Foreign Application Priority Data

Sep. 25, 2015  (JP) .................. 2015-188961

(51) Int. Cl.

| | |
|---|---|
| H05K 1/00 | (2006.01) |
| H05K 1/09 | (2006.01) |
| H05K 1/11 | (2006.01) |
| G06K 9/00 | (2006.01) |
| H05K 1/03 | (2006.01) |
| H05K 3/46 | (2006.01) |
| H05K 1/16 | (2006.01) |

(52) U.S. Cl.
CPC ......... G06K 9/0002 (2013.01); H05K 1/0366 (2013.01); H05K 3/4644 (2013.01); H05K 1/162 (2013.01); H05K 2201/017 (2013.01); H05K 2201/029 (2013.01); H05K 2201/09236 (2013.01); H05K 2201/10151 (2013.01)

(58) Field of Classification Search
CPC ............. G06K 9/0002; H05K 1/0366; H05K 2201/017; H05K 2201/09236; H05K 2201/10151; H05K 1/162; H05K 3/4644; H05K 2201/029
USPC ........................................ 174/257, 258, 261
See application file for complete search history.

(56) References Cited

U.S. PATENT DOCUMENTS

| | | | |
|---|---|---|---|
| 6,462,563 B1 | 10/2002 | Kawahara et al. | |
| 2007/0111387 A1* | 5/2007 | Oi .................. | H01L 21/4814 438/108 |

(Continued)

FOREIGN PATENT DOCUMENTS

| | | |
|---|---|---|
| JP | 2000-323205 A | 11/2000 |
| JP | 2001-046359 A | 2/2001 |

(Continued)

OTHER PUBLICATIONS

Taiwan Office Action with English concise explanation, Taiwanese Patent Application No. 105130803, dated Aug. 14, 2017, 8 pgs.

(Continued)

Primary Examiner — Sherman Ng
(74) Attorney, Agent, or Firm — Volpe and Koenig, P.C.

(57) ABSTRACT

A wiring board for a fingerprint sensor includes a core insulating layer having a thickness of 30 μm to 100 μm, an inner buildup insulating layer having a thickness of 17 μm to 35 μm, an outer buildup insulating layer having a thickness of 7 μm to 25 μm, a plurality of fingerprint reading outer strip-shaped electrodes, a plurality of fingerprint reading inner strip-shaped electrodes, and an upper solder resist layer covering the outer strip-shaped electrodes by a thickness of 3 μm to 15 μm.

6 Claims, 3 Drawing Sheets

(56) References Cited

U.S. PATENT DOCUMENTS

| | | | | |
|---|---|---|---|---|
| 2012/0153463 A1* | 6/2012 | Maeda | .................... | H05K 1/115 |
| | | | | 257/737 |
| 2014/0034367 A1* | 2/2014 | Lee | ...................... | H05K 1/0373 |
| | | | | 174/255 |
| 2014/0182889 A1* | 7/2014 | Shin | ..................... | H05K 3/4673 |
| | | | | 174/251 |
| 2015/0027758 A1* | 1/2015 | Maeda | .................... | H05K 3/421 |
| | | | | 174/255 |
| 2015/0101851 A1* | 4/2015 | Ko | ...................... | H05K 1/0306 |
| | | | | 174/258 |

FOREIGN PATENT DOCUMENTS

| | | |
|---|---|---|
| JP | 2007-201453 A | 8/2007 |
| TW | I252436 B | 4/2006 |
| TW | M484793 U | 8/2014 |
| WO | 2004/057523 A1 | 7/2004 |

OTHER PUBLICATIONS

Korean Office Action with English concise explanation, Korean Patent Application No. 2016-121447, dated Apr. 24, 2017, 7 pgs.

* cited by examiner

WIRING BOARD FOR FINGERPRINT SENSOR

BACKGROUND OF THE INVENTION

1. Technical Field

The present disclosure relates to a wiring board for a fingerprint sensor.

2. Background

FIG. 5 is a schematic cross-sectional view illustrating a conventional wiring board 20 for a fingerprint sensor. The conventional wiring board 20 for the fingerprint sensor includes an insulating board 11, a wiring conductor 12, and a solder resist layer 13. The conventional wiring board for a fingerprint sensor is disclosed in Japanese Unexamined Patent Publication No. 2001-46359, for example.

The insulating board 11 has a structure in which a buildup insulating layer 11b is laminated on each of upper and lower surfaces of a core insulating layer 11a. The core insulating layer 11a is made of thermosetting resin including glass cloth. A thickness of the core insulating layer 11a is 150 μm to 200 μm. The core insulating layer 11a has a plurality of through-holes 14. The buildup insulating layer 11b is made of thermosetting resin not including glass cloth. A thickness of the buildup insulating layer 11b is 25 μm to 40 μm. The buildup insulating layer 11b has a plurality of via-holes 15.

The wiring conductor 12 is adhered to the upper and lower surfaces of the core insulating layer 11a, an inner side of the through-hole 14, a surface of the buildup insulating layer 11b, and an inner side of the via-hole 15. The wiring conductor 12 is made of plated copper. A thickness of the wiring conductor 12 is 10 μm to 20 μm.

The wiring conductor 12 formed on the uppermost layer partially serves as an outer strip-shaped electrode 16 for reading a fingerprint. Each of the outer strip-shaped electrodes 16 has a thin strip-shaped pattern, and they are arranged parallel to each other along a first direction. The wiring conductor 12 positioned next to that on the uppermost layer across the uppermost buildup insulating layer 11b partially serves as a fingerprint reading inner strip-shaped electrode 17. Each of the inner strip-shaped electrodes 17 has a thin strip-shaped pattern, and they are arranged parallel to each other along a second direction perpendicular to the first direction. The outer strip-shaped electrodes 16 and the inner strip-shaped electrodes 17 vertically overlap and perpendicularly intersect with each other with the uppermost insulating layer 11b sandwiched between them.

The wiring conductor 12 formed on the lowermost layer partially serves as an external connection pad 18. The predetermined external connection pad 18, outer strip-shaped electrode 16, and inner strip-shaped electrode 17 are connected to each other through the wiring conductors 12.

The solder resist layer 13 is adhered to cover the uppermost and lowermost buildup insulating layers 11b and the wiring conductors 12 formed on their surfaces. The solder resist layer 13 is made of thermosetting resin. The solder resist layer 13 contains dispersed silica powder as a filler. A thickness of the solder resist layer 13 on the surface of the wiring conductor 12 is 10 μm to 20 μm. The upper solder resist layer 13 completely covers the wiring conductor 12. The lower solder resist layer 13 has an opening to expose the external connection pad 18.

When a finger is put on an upper surface of the wiring board 20 for a fingerprint sensor and a voltage is applied to the outer strip-shaped electrode 16, electrostatic capacitance is formed between the outer strip-shaped electrode 16 and a finger surface which are opposed across the upper solder resist layer 13. This electrostatic capacitance is high at a projected portion of the fingerprint, and low at a recessed portion of the fingerprint. Thus, a difference in the electrostatic capacitance is detected by sequentially scanning the plurality of outer strip-shaped electrodes 16 and the plurality of inner strip-shaped electrodes 17 while applying a voltage to them, and the fingerprint can be read by processing the detected difference with an external processor.

The wiring board 20 for the fingerprint sensor is required to be reduced in thickness, in addition to being improved in sensitivity for reading the fingerprint. However, according to the conventional wiring board 20 for the fingerprint sensor, the solder resist layer 13 is made of thermosetting resin containing the silica filler, and its relative permittivity is as low as 3.2 to 3.6 in GHz bandwidth. Therefore, electrostatic capacitance to be formed between the outer strip-shaped electrode 16 and the finger surface is small, and it is difficult to enhance the sensitivity for reading the fingerprint. In addition, the thickness of the core insulating layer 11a is as large as 150 μm to 250 μm to ensure mechanical strength, so that it is difficult to reduce the thickness.

SUMMARY

A wiring board for a fingerprint sensor in the present disclosure includes a core insulating layer containing thermosetting resin including reinforcement material, and having a thickness of 30 μm to 100 μm, an inner buildup insulating layer laminated on each of upper and lower surfaces of the core insulating layer, containing thermosetting resin including reinforcement material, and having a thickness of 17 μm to 35 μm, an outer buildup insulating layer laminated on a surface of the inner buildup insulating layer, containing thermosetting resin, and having a thickness of 7 μm to 25 μm, a plurality of fingerprint reading outer-strip-shaped electrodes formed on a surface of the upper outer buildup insulating layer and arranged parallel to each other along a first direction, a plurality of fingerprint reading inner strip-shaped electrodes formed on a surface of the upper inner buildup insulating layer and arranged parallel to each other along a second direction perpendicular to the first direction, and an upper solder resist layer adhered to the upper outer buildup insulating layer and the outer strip-shaped electrodes, containing thermosetting resin, having a relative permittivity of 4 to 10 in GHz bandwidth, and covering the outer strip-shaped electrodes by a thickness of 3 μm to 15 μm.

DETAILED DESCRIPTION

According to a wiring board for a fingerprint sensor in the present disclosure, a solder resist layer covering outer strip-shaped electrodes for reading a fingerprint has a high relative permittivity of 4 to 10 in GHz bandwidth, and has a small thickness of 3 µm to 15 µm on the outer strip-shaped electrodes. Therefore, electrostatic capacitance to be formed between the outer strip-shaped electrode and the finger surface can be high, which enhances sensitivity for reading the fingerprint. Furthermore, according to the wiring board for a fingerprint sensor in the present disclosure, a core insulating layer and an inner buildup insulating layer are both made of thermosetting resin including reinforcement material. Therefore, even when a thickness of the core insulating layer is reduced to 30 µm to 100 µm, sufficient mechanical strength can be ensured by the inner buildup insulating layer having a thickness of 17 µm to 35 µm. As a result, the wiring board for a fingerprint sensor can be reduced in thickness.

Figure 1:
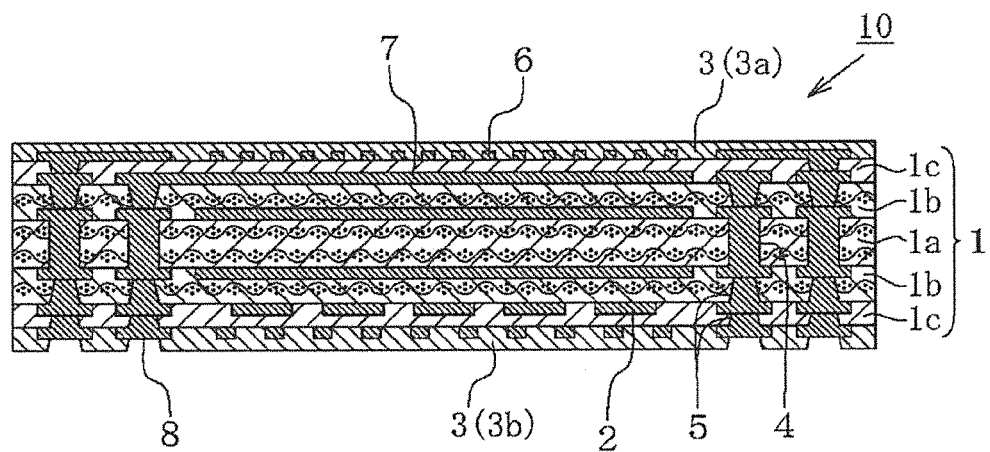
FIG. 1 is a schematic cross-sectional view illustrating a wiring board for a fingerprint sensor in one embodiment of the present disclosure.

Next, a wiring board for a fingerprint sensor in one embodiment of the present disclosure will be described with reference to FIGS. 1 to 4. As illustrated in FIG. 1, a wiring board 10 in the one embodiment includes an insulating board 1, a wiring conductor 2, and a solder resist layer 3.

The insulating board 1 has a structure in which an inner buildup insulating layer 1b and an outer buildup insulating layer 1c are laminated on each of upper and lower surfaces of a core insulating layer 1a. Each of the core insulating layer 1a and the inner buildup insulating layer 1b contains thermosetting resin including glass cloth. The outer buildup insulating layer 1c contains thermosetting resin not including glass cloth. The thermosetting resins for the insulating layers include epoxy resin and bismaleimide triazine resin. The thermosetting resin may contain a dispersed inorganic insulator filler such as aluminum hydroxide or silica. A thickness of the core insulating layer 1a is 30 µm to 100 µm. The core insulating layer 1a has a plurality of through-holes 4. A diameter of the through-hole 4 is 60 µm to 95 µm. A thickness of the inner buildup insulating layer 1b is 17 µm to 35 µm. A thickness of the outer buildup insulating layer 1c is 7 µm to 25 µm. Each of the inner buildup insulating layer 1b and the outer buildup insulating layer 1c has a plurality of via-holes 5. A diameter of the via-hole 5 is 20 µm to 70 µm.

The wiring conductor 2 is adhered to the upper and lower surfaces of the core insulating layer 1a, an inner side of the through-hole 14, surfaces of the inner buildup insulating layer 1b and the outer buildup insulating layer 1c, and an inner side of the via-hole 5. The wiring conductor 2 is formed of plated copper. A thickness of the wiring conductor 2 is 7 µm to 25 µm on the upper surface of the core insulating layer 1a, the surface of the inner buildup insulating layer 1b, and the surface of the lower outer buildup insulating layer 1c, and is 3 µm to 15 µm on the surface of the upper outer buildup insulating layer 1c.

Figure 2:
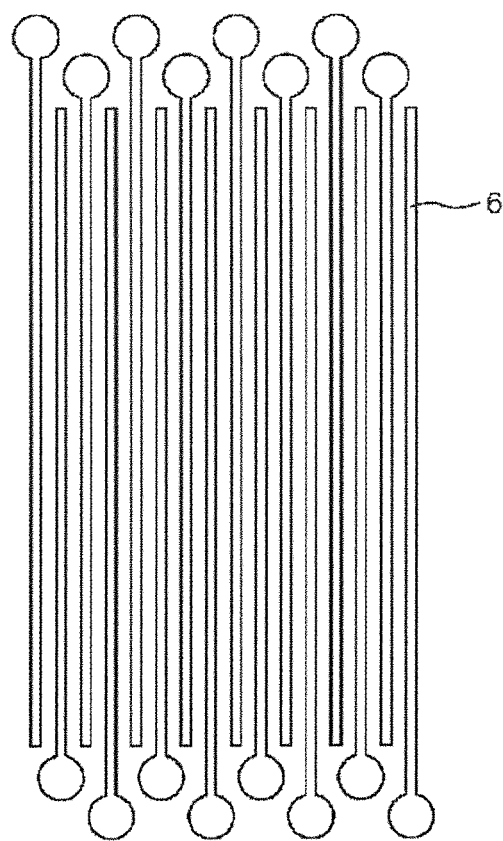
FIG. 2 is a schematic plan view illustrating outer strip-shaped electrodes in the wiring board for a fingerprint sensor illustrated in FIG. 1.

The wiring conductor 2 on the surface of the upper outer buildup insulating layer 1c partially serves as an outer strip-shaped electrode for reading a fingerprint 6. As illustrated in FIG. 2, each of the outer strip-shaped electrodes 6 has a thin strip-shaped pattern, and they are arranged parallel to each other along a first direction. A width of the outer strip-shaped electrode 6 is 5 µm to 18 µm, and a distance between the adjacent outer strip-shaped electrodes 6 is 15 µm to 30 µm.

Figure 3:
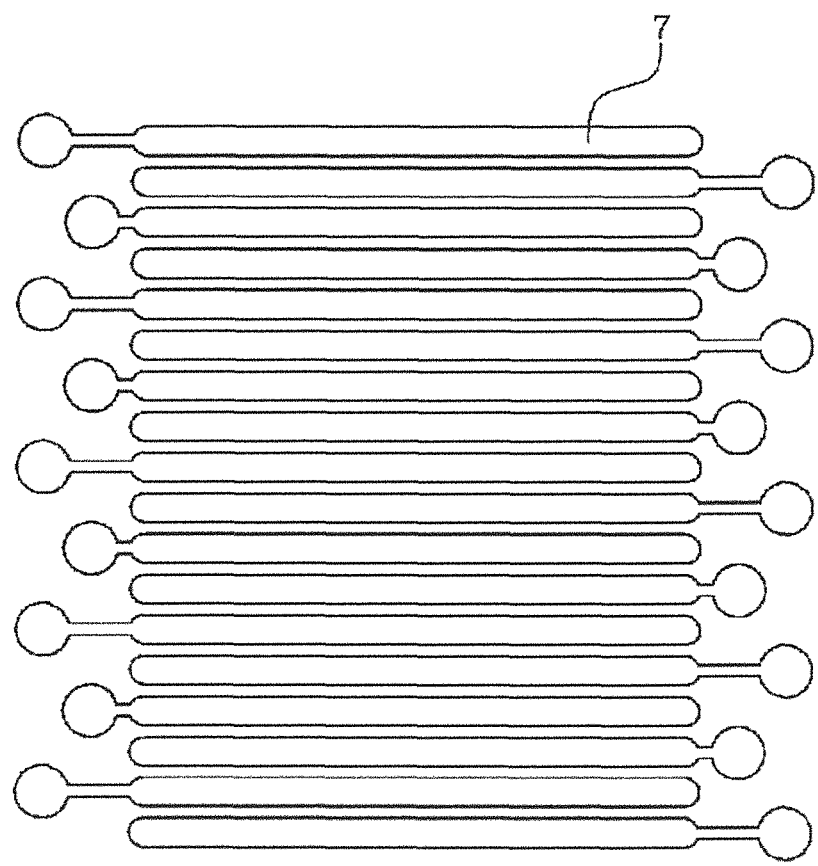
FIG. 3 is a schematic plan view illustrating inner strip-shaped electrodes in the wiring board for a fingerprint sensor illustrated in FIG. 1.
Figure 4:
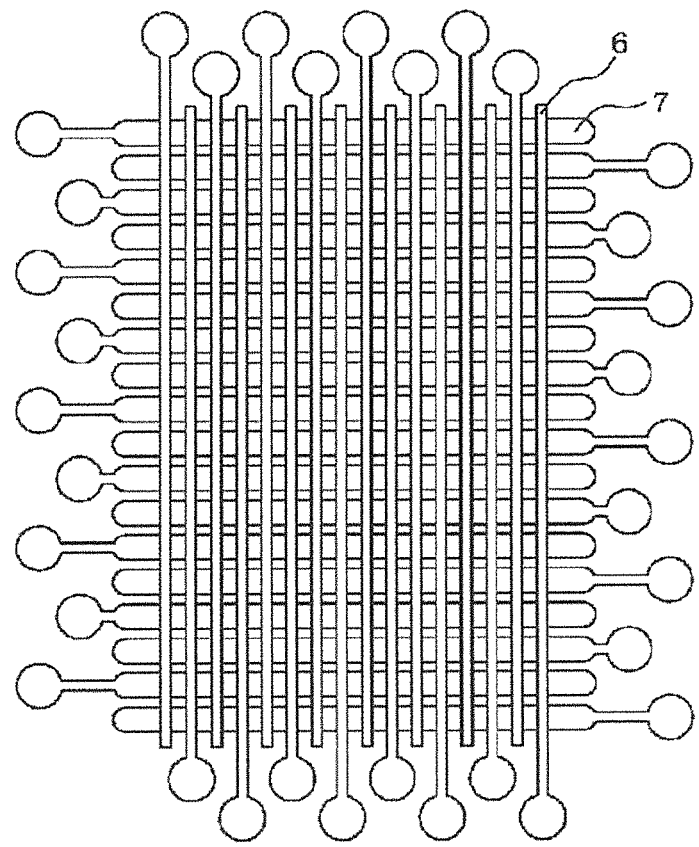
FIG. 4 is a schematic plan view illustrating a state in which the outer strip-shaped electrodes in FIG. 2 and the inner strip-shaped electrodes in FIG. 3 vertically overlap with each other.
Figure 5:
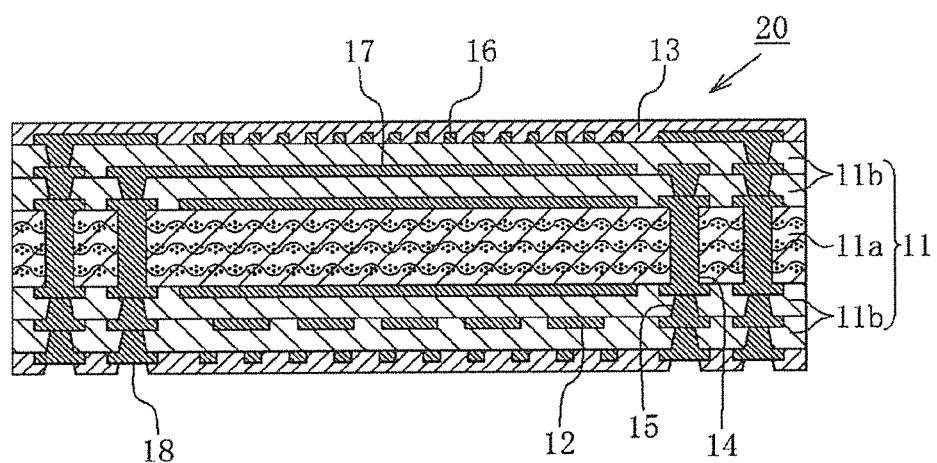
FIG. 5 is a schematic cross-sectional view illustrating a conventional wiring board for a fingerprint sensor.

The wiring conductor 2 adhered to the surface of the upper inner buildup insulating layer 1b partially serves as an inner strip-shaped electrode for reading the fingerprint 7. As illustrated in FIG. 3, each of the inner strip-shaped electrodes 7 has a thin strip-shaped pattern, and they are arranged parallel to each other along a second direction perpendicular to the first direction. A width of the inner strip-shaped electrode 7 is 20 µm to 35 µm, and a distance between the adjacent inner strip-shaped electrodes 7 is 40 µm to 60 µm. As illustrated in FIG. 4, the outer strip-shaped electrodes 6 and the inner strip-shaped electrodes 7 vertically overlap and perpendicularly intersect with each other.

The wiring conductor 2 on the surface of the lower outer buildup insulating layer 1c partially serves as an external connection pad 8. The external connection pad 8 has a circular shape having a diameter of 300 µm to 400 µm. The predetermined external connection pad 8, outer strip-shaped electrode 6, and inner strip-shaped electrode 7 are electrically connected through the wiring conductor 2.

The solder resist layer 3 is adhered to cover the upper and lower outer buildup insulating layers 1c and the wiring conductors 2 formed on the surfaces of them. The solder resist layer 3 contains thermosetting resin. The thermosetting resin includes acrylic modified epoxy resin. The solder resist layers 3 include an upper solder resist layer 3a and a lower solder resist layer 3b. The upper solder resist layer 3a completely covers the wiring conductor 2. The lower solder resist layer 3b has an opening to expose the external connection pad 8.

When a finger is put on an upper surface of the wiring board 10 for a fingerprint sensor and a voltage is applied to the outer strip-shaped electrode 6, electrostatic capacitance is formed between the outer strip-shaped electrode 6 and a finger surface which are opposed across the upper solder resist layer 3a. This electrostatic capacitance is high at a projected portion of the fingerprint, and low at a recessed portion of the fingerprint. Thus, a difference in the electrostatic capacitance is detected by sequentially scanning the plurality of outer strip-shaped electrodes 6 and the plurality of inner strip-shaped electrodes 7 while applying a voltage to them. Thus, the fingerprint can be read by processing the detected difference with an external processor.

Here, according to the wiring board 10 for the fingerprint sensor, the upper solder resist layer 3a and the lower solder resist layer 3b differ in relative permittivity and thickness. The upper solder resist layer 3a has a relative permittivity of 4 to 10 in GHz bandwidth and a thickness of 3 µm to 15 µm on the outer strip-shaped electrode 6. The upper solder resist layer 3a may have relative permittivity of to in GHz bandwidth and a thickness of µm to µm on the outer strip-shaped electrode 6. The upper solder resist layer 3a contains 10% to 20% by volume of filler material having a relatively high relative permittivity such as barium sulfate powder, zirconium oxide powder, titanium oxide powder, or aluminum oxide powder.

The lower solder resist layer 3b has a relative permittivity of 3.2 to 3.5 in GHz bandwidth and a thickness of 8 µm to 25 µm on the surface of the wiring conductor 2. The lower solder resist layer 3b contains 10% to 20% by volume of filler material having a relatively low relative permittivity such as silicon oxide powder.

Thus, according to the wiring board 10 for the fingerprint sensor in the one embodiment, the solder resist layer 3a covering the outer strip-shaped electrode for reading the fingerprint 6 has the high relative permittivity of 4 to 10 in GHz bandwidth and the small thickness of 3 µm to 15 µm on the outer strip-shaped electrode. Therefore, the electrostatic capacitance to be formed between the outer strip-shaped electrode 6 and the finger surface can be high, which can enhance the sensitivity for reading the fingerprint. Furthermore, according to the wiring board 10 for the fingerprint sensor in the one embodiment, the core insulating layer 1a and the inner buildup insulating layer 1b are both formed of thermosetting resin containing glass cloth. Therefore, even when the thickness of the core insulating layer 1a is reduced to 30 μm to 100 μm, the sufficient mechanical strength can be ensured by the inner buildup insulating layer 1b having the thickness of 17 μm to 35 μm.

The wiring board for a fingerprint sensor in the present disclosure is not limited to the one in the above embodiment, and various modifications can be allowed without departing from the scope of the present disclosure. According to the wiring board 10 for the fingerprint sensor in the one embodiment, the glass cloth is used as reinforcement material. However, other than glass cloth, may be used as the reinforcement material.

According to the wiring board 10 for the fingerprint sensor in the one embodiment, the outer buildup insulating layer 1c contains thermosetting resin not including glass cloth. However, the outer buildup insulating layer may be formed of thermosetting resin including glass cloth as reinforcement material.

The wiring board 10 for the fingerprint sensor in the one embodiment, as illustrated in FIG. 1, includes the lower solder resist layer 3b. However, the lower solder resist layer may be formed as needed and it is not always required to be formed.

What is claimed is:

1. A wiring board for a fingerprint sensor comprising:
   a core insulating layer containing thermosetting resin including reinforcement material, and having a thickness of 30 μm to 100 μm;
   an inner buildup insulating layer laminated on each of upper and lower surfaces of the core insulating layer, containing thermosetting resin including reinforcement material, and having a thickness of 17 μm to 35 μm;
   an outer buildup insulating layer laminated on a surface of the inner buildup insulating layer, containing thermosetting resin, and having a thickness of 7 μm to 25 μm;
   a plurality of outer strip-shaped electrodes for reading a fingerprint formed on a surface of the upper outer buildup insulating layer and arranged parallel to each other along a first direction;
   a plurality of inner strip-shaped electrodes for reading a fingerprint formed on a surface of the upper inner buildup insulating layer and arranged parallel to each other along a second direction perpendicular to the first direction; and
   an upper solder resist layer adhered to the upper outer buildup insulating layer and the outer strip-shaped electrodes, containing thermosetting resin, having a relative permittivity of 4 to 10 in GHz bandwidth, and covering the outer strip-shaped electrodes by a thickness of 3 μm to 15 μm.

2. The wiring board according to claim 1, wherein the thermosetting resin contained in the outer buildup insulating layer does not contain reinforcement material.

3. The wiring board according to claim 1, wherein the reinforcement material is glass cloth.

4. The wiring board according to claim 1, further comprising a lower solder resist layer adhered to the lower outer buildup insulating layer.

5. The wiring board according to claim 4, wherein the lower solder resist layer has a relative permittivity different from a relative permittivity of the upper solder resist layer.

6. The wiring board according to claim 4, wherein the lower solder resist layer has a thickness different from a thickness of the upper solder resist layer.

* * * * *